(12) United States Patent
Watanabe

(10) Patent No.: US 6,748,972 B2
(45) Date of Patent: Jun. 15, 2004

(54) WATER TANK, COOLING TOWER INCLUDING THE SAME AND METHOD OF MANUFACTURING SEMICONDUCTOR DEVICE

(75) Inventor: Mitsuaki Watanabe, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/839,375

(22) Filed: Apr. 23, 2001

(65) Prior Publication Data

US 2001/0045234 A1 Nov. 29, 2001

(30) Foreign Application Priority Data

May 29, 2000 (JP) ........................................ 2000-157869
Feb. 9, 2001 (JP) ........................................ 2001-033614

(51) Int. Cl.[7] .................................................. F17D 1/20
(52) U.S. Cl. .................... 137/590; 137/561 A; 137/574; 137/340
(58) Field of Search ........................... 137/574, 561 A, 137/590, 334, 341

(56) References Cited

U.S. PATENT DOCUMENTS

| 2,920,648 A | * | 1/1960 | Sheffer | 137/590 |
|---|---|---|---|---|
| 2,946,345 A | * | 1/1960 | Weltmer | 137/590 |
| 3,727,725 A | * | 4/1973 | Dahm | 184/6.24 |
| 3,782,416 A | * | 1/1974 | Levin | 137/590 |
| 4,140,178 A | * | 2/1979 | Ohlswager et al. | 137/561 A |
| 4,394,966 A | * | 7/1983 | Snyder et al. | 239/127 |
| 6,014,987 A | * | 1/2000 | List et al. | 137/549 |

FOREIGN PATENT DOCUMENTS

JP     11-304397     11/1999

* cited by examiner

Primary Examiner—A. Michael Chambers
(74) Attorney, Agent, or Firm—McDermott, Will & Emery

(57) ABSTRACT

A water tank includes a bottom surface having a suction opening for draining water, and an air-suction preventing member covering the suction opening, spaced with a gap allowing water to flow into the suction opening, above the bottom surface. The air-suction preventing member is so arranged as to interrupt suction of air by the suction opening due to generation of a vortex at the suction opening. The arrangement provides a water tank free of any possible failure and having a simple structure not increasing weight and cost, preventing the air from being sucked in.

5 Claims, 3 Drawing Sheets

FIG. 5       PRIOR ART
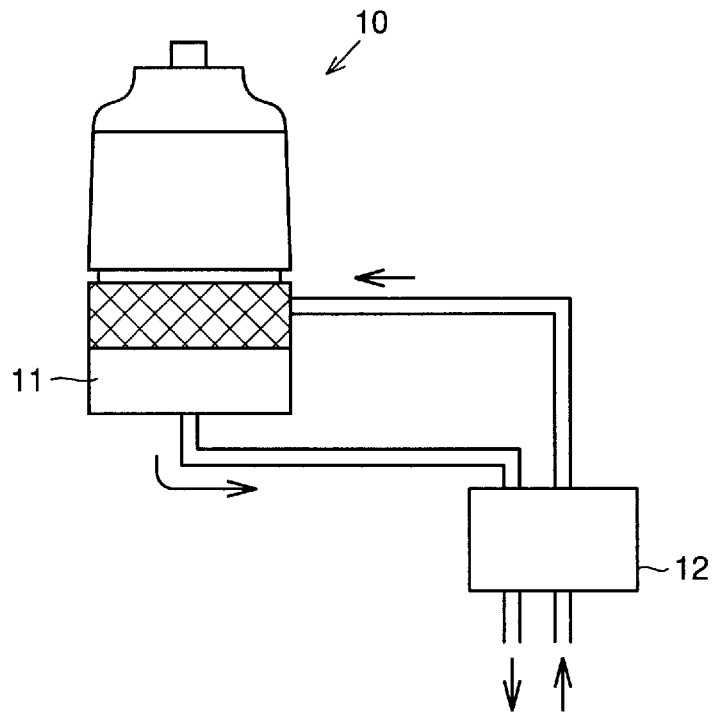
FIG. 6       PRIOR ART
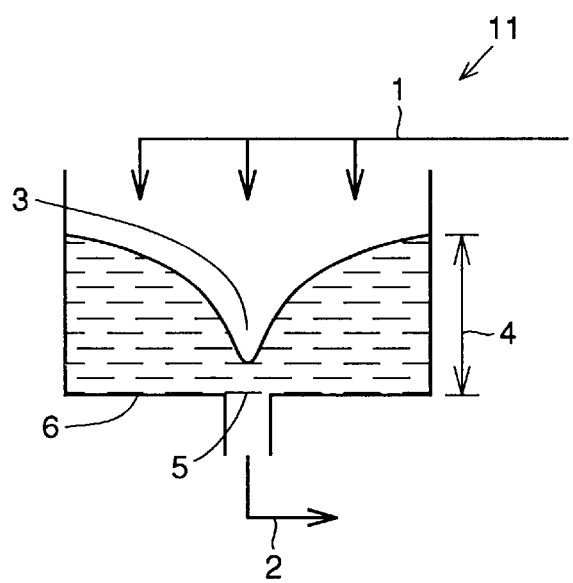

WATER TANK, COOLING TOWER INCLUDING THE SAME AND METHOD OF MANUFACTURING SEMICONDUCTOR DEVICE

BACKGROUND OF THE INVENTION

1. Field of the Invention

The present invention relates to a cooling tower used in air conditioning or cooling facilities utilized in buildings, factories and so forth, and to a lower water tank included therein, and further to a method of manufacturing a semiconductor device.

2. Description of the Background Art

Referring to FIG. 5, a positioning of a cooling tower is described. A cooling tower 10 is fed with heated circulating water (also referred to as "cooling water") from a refrigeration machine 12 in an air conditioning or cooling facility, releases heat of the circulating water by exchanging the heat between the circulating water and outside air, and subsequently feeds the circulating water back to the refrigeration machine. Cooling tower 10 has a water tank 11 as a so-called lower water tank. Water tank 11 receives and impounds the circulating water sprinkled within cooling tower 10.

In water tank 11 with a suction opening 5 on a bottom surface 6 as shown in FIG. 6, the circulating water can be circulated without a problem when a water level is high enough, while a vortex 3 tends to be generated above suction opening 5 as a water level 4 attains to a certain level or lower. If this vortex 3 develops, the water surface may go down toward the center of the vortex and air may be sucked in from suction opening 5. This tends to occur particularly at a startup. Air suction from suction opening 5 is problematic, as heat-exchange effectiveness in refrigerator 12 may be reduced, or the refrigerator may even be stopped in an extreme case.

In order to avoid this problem, a conventional technology has been proposed in that a water depth of water tank 11 is made deeper. However, increasing of the water depth of water tank 11 increases weight of cooling tower 10, which will be inconvenient since, when water tank 11 is located on a structure such as a building, an engineering work may be required to reinforce the structure.

Further, a method of controlling a pumping ability of a pump at a startup, and a method of providing a mechanism preventing air from flowing in by a mechanical operation as disclosed in Japanese Patent Laying-Open No. 11-304397, have been proposed. However, a control mechanism such as a water level sensor must be provided to control a pumping ability of a pump at the startup, resulting in a complicated structure of the cooling tower and increased cost. Even when the mechanical operation is employed, a structure performing the mechanical operation must be incorporated, also resulting in increased cost. Further, as long as it is an operating machine, a possibility of failure could not be eliminated.

An object of the present invention is, therefore, to provide a water tank having a simple structure and capable of preventing suction of air without any increase of weight and cost, a cooling tower including the water tank, and a method of manufacturing a semiconductor device.

SUMMARY OF THE INVENTION

To accomplish the object described above, a water tank according to the present invention includes a bottom surface having a suction opening for draining water, and an air-suction preventing member covering the suction opening, spaced with a gap allowing water to flow into the suction opening, above the bottom surface. As the suction opening is covered by the air-suction preventing member, this arrangement can prevent a vortex from generating around the center of the suction opening even when a water level is lowered, and hence can prevent air from being sucked in.

In the invention described above, preferably, the air-suction preventing member is so arranged as to interrupt the suction of air by the suction opening due to the generation of the vortex at the suction opening. This arrangement allows an air-sucking phenomenon caused by the generation of the vortex to be interrupted by the air-suction preventing member. Thus, the air suction can be prevented.

A cooling tower according to the present invention includes the water tank described above. This arrangement can prevent air suction by a suction opening even when a water level of the water tank is lowered, and therefore, the cooling tower is free from the problem such that heat-exchange effectiveness of a refrigerator is reduced, or the refrigerator is stopped.

A method of manufacturing a semiconductor device according to the present invention uses the cooling tower described above. The method allows stable cooling and hence stable manufacturing of a high-quality semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic illustration of a cooling tower according to a prior art; and FIG. 6 is an explanatory illustration of generation of a vortex in a water tank according to a prior art.

DESCRIPTION OF THE PREFERRED EMBODIMENTS

First Embodiment

Figure 1:
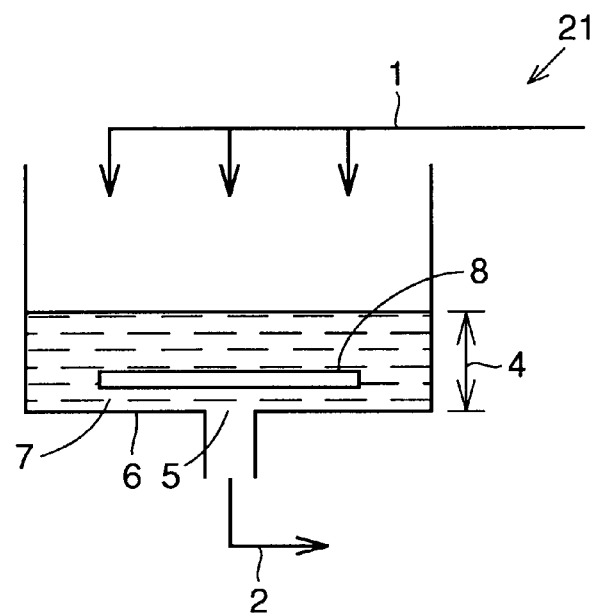
FIG. 1 is a schematic illustration of an example of a water tank according to a first embodiment of the present invention.

Referring to FIG. 1, a water tank 21 according to the present embodiment is described. Water tank 21 is fed with circulating water 1 from the above and drains circulating water 2 down the below. This is of a type having a suction opening 5 for draining circulating water 2 at a bottom surface 6. Further, spaced with a gap 7 allowing water to flow into suction opening 5, an air-suction preventing member 8 is provided above bottom surface 6, covering suction opening 5. In FIG. 1, though air-suction preventing member 8 is depicted to be floating in the water, air-suction preventing member 8 can be fixed by an arbitrary known technique, e.g., by providing a strut on bottom surface 6 or a side surface. Air-suction preventing member 8 may have any shape as long as it covers suction opening 5 above bottom surface 6 and spaced therefrom with gap 7.

Moreover, the air-suction preventing member is preferably so arranged as to interrupt suction of air by the suction opening due to generation of a vortex at the suction opening.

Figure 2:
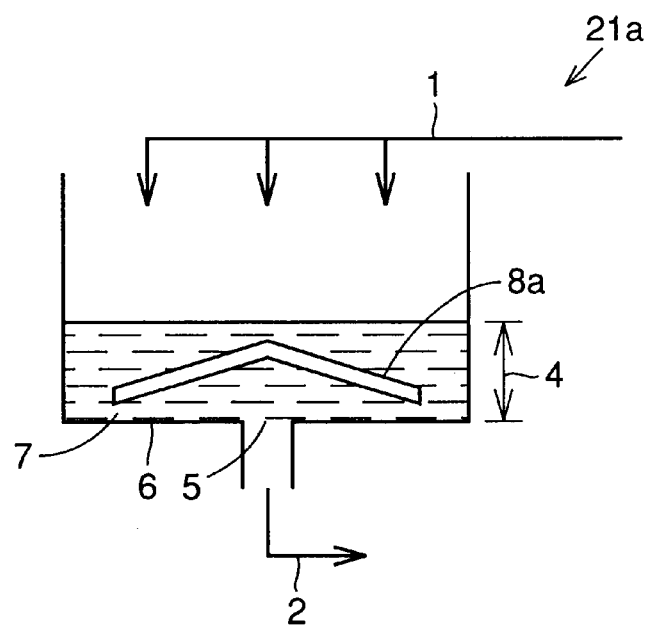
FIG. 2 is a schematic illustration of another example of a water tank according to the first embodiment of the present invention.

Air-suction preventing member 8 having a shape shown in FIG. 1 is merely an example and a water tank 21a with an air-suction preventing member 8a in such a shape as shown in FIG. 2, for another example, may also be used.

Water tanks 21 and 21a with such arrangements are provided with air-suction preventing members 8 and 8a, so that generation of a vortex 3 above suction opening 5 can be prevented. Thus, even when a water level 4 is lowered, the suction of air due to vortex 3 can also be prevented. Further, air-suction preventing members 8 and 8a are not operating mechanical parts but rather, they are mere members for preventing entrance of the air, so that there is no possibility of failure, and the increase of weight and cost associated therewith can be negligible.

Second Embodiment

Figure 3:
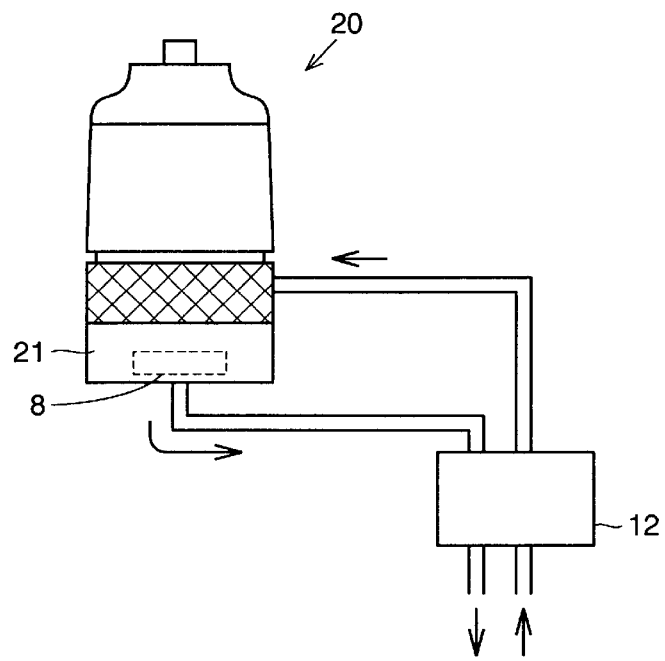
FIG. 3 is a schematic illustration of a cooling tower according to a second embodiment of the present invention.

Referring to FIG. 3, a cooling tower 20 according to the present embodiment is described. This cooling tower 20 includes, as a lower water tank, water tank 21 described in the first embodiment. Thus, even when a water level 4 is lowered, air suction can be prevented, and therefore, a cooling tower is free from the problem such that heat-exchange effectiveness of the refrigerator is reduced, or the refrigerator is stopped.

Further, as a result, cooling tower 20 can be used with a water level lower than that of cooling tower 10 having conventional water tank 11 (see FIG. 4), so that weight of the cooling tower when used can be reduced by reducing an amount of water impounded in the tank. The reduction of the weight of the cooling tower in use can reduce strength required to a structure on which the cooling tower is installed.

The present invention includes an air-suction preventing member covering the suction opening, preventing a vortex from generating around the center of the suction opening even when the water level is lowered, therefore a water tank capable of prevention of air suction by the suction opening is provided.

Third Embodiment

Figure 4:
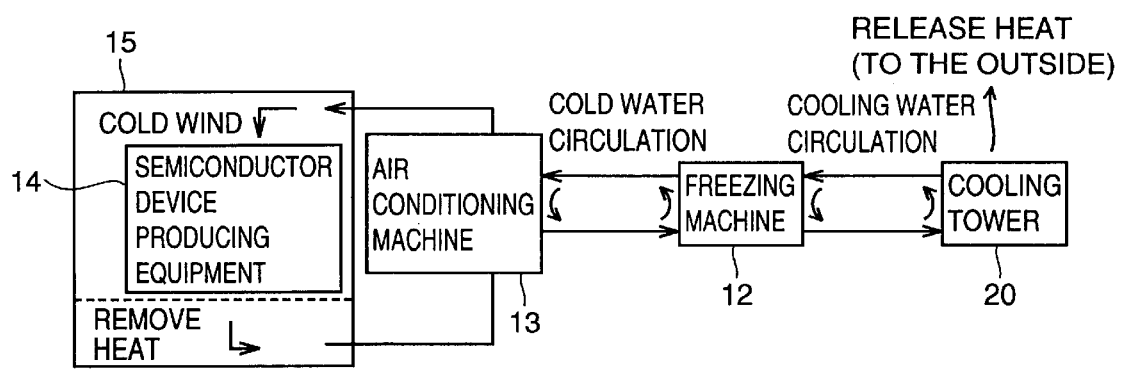
FIG. 4 illustrates a method of manufacturing a semiconductor device according to the third embodiment of the present invention.

Referring to FIG. 4, a method of manufacturing a semiconductor device according to the present embodiment is described. A semiconductor device such as an IC (Integrated Circuit) is produced in an environment where dust in the air is removed to a level much closer to 0, and where temperature and humidity in a room are kept constant. Such an environment can generally be realized in the form of a clean room 15.

In clean room 15, because of heat generated from equipment producing a semiconductor device, if the clean room was left uncontrolled with respect to the temperature, the temperature would be raised and the humidity would be reduced, preventing normal production of the semiconductor device.

Therefore, as shown in FIG. 4, cooling tower 20 described in the second embodiment according to the present invention is used. A semiconductor device producing equipment 14 is installed in clean room 15 to produce a semiconductor device. Connected to clean room 15 is an air conditioning machine 13 including a cold water coil, i.e. a heat exchanger, for cooling the air. Air conditioning machine 13 provides cold wind into clean room 15 to remove heat. A freezing machine 12 is connected to air conditioning machine 13, and cold water circulates between air conditioning machine 13 and freezing machine 12. Cooling tower 20 is connected to freezing machine 12, and cooling water circulates between freezing machine 12 and cooling tower 20. By using thus configured installation, the heat generated from semiconductor device producing equipment 14 in clean room 15 is transferred to air conditioning machine 13, to freezing machine 12 and to cooling tower 20 in this order by heat-exchanging, and is eventually released into the air outside. Use of such a manufacturing method in manufacturing a semiconductor device can prevent the possibility of a problem such as stopping of a freezing machine due to air suction in a cooling tower, so that stable cooling of the production environment and hence stable manufacturing of a high-quality semiconductor device can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fluid bearing vessel comprising:
   a bottom surface having a suction opening for draining a fluid; and
   a substantially planar air-suction preventing member, having a transverse dimension greater than that of said suction opening, transversely disposed above said bottom surface and over said suction opening, the air-suction preventing member being spaced apart from the bottom surface by a gap so as to permit said fluid to flow from the tank into said suction opening only through said gap.

2. A fluid bearing vessel according to claim 1, wherein said air-suction preventing member is so arranged as to interrupt suction of air by said suction opening due to generation of a vortex at said suction opening.

3. A fluid bearing vessel including:
   a bottom surface having a suction opening for draining a fluid; and
   an air-suction preventing member, having a substantially frustoconical bottom surface and having a transverse dimension greater than that of said suction opening, transversely disposed above said bottom surface and over said suction opening, the air-suction preventing member substantially frustoconical bottom surface being spaced apart from the bottom surface of the fluid bearing vessel by a gap so as to permit said fluid to flow from the tank into said suction opening only through said gap, and wherein said gap continuously increases between an outer extent of said substantially frustoconical bottom surface and a center of said substantially frustoconical bottom surface.

4. A fluid bearing vessel according to claim 3, wherein said air-suction preventing member is so arranged as to interrupt suction of air by said suction opening due to generation of a vortex at said suction opening.

5. A method of manufacturing a semiconductor device comprising the step of:
   using a cooling tower to cool a room containing semiconductor producing equipment, said cooling tower including:

a water tank,
a bottom surface having a suction opening for draining water, and
an air-suction preventing member covering said suction opening, spaced with a gap allowing water to flow into said suction opening, above said bottom surface,
wherein said air-suction preventing member is so arranged as to interrupt suction of air by said suction opening due to generation of a vortex at said suction opening,
wherein a bottom surface of said air-suction preventing member is substantially planar or is substantially frustoconical so as to continuously increase a size of said gap over substantially an entire distance between a periphery of said air-suction preventing member and a center of said air-suction preventing member.

* * * * *